(12) United States Patent
Jung

(10) Patent No.: US 8,637,363 B1
(45) Date of Patent: Jan. 28, 2014

(54) METHODS OF MANUFACTURING A SEMICONDUCTOR DEVICE HAVING A NODE ARRAY

(71) Applicant: SK hynix Inc., Icheon-si (KR)

(72) Inventor: Yong Soon Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/718,950

(22) Filed: Dec. 18, 2012

(51) Int. Cl.
*H01L 21/8234* (2006.01)
*H01L 21/8244* (2006.01)

(52) U.S. Cl.
USPC .......... 438/238; 438/381; 438/942; 438/975; 257/E21.646; 257/E21.023; 257/E21.035

(58) Field of Classification Search
USPC .......... 438/238, 381, 942, 975; 257/E21.646, 257/E21.023, E21.035
See application file for complete search history.

(56) References Cited

U.S. PATENT DOCUMENTS

| | | | |
|---|---|---|---|
| 6,730,956 B2 * | 5/2004 | Bae et al. | 257/306 |
| 2004/0126986 A1 * | 7/2004 | Wise et al. | 438/424 |
| 2006/0211192 A1 * | 9/2006 | Cho et al. | 438/238 |

FOREIGN PATENT DOCUMENTS

| | | |
|---|---|---|
| KR | 1020020078086 A | 10/2002 |
| KR | 1020100093773 A | 8/2010 |
| KR | 1020110060757 A | 6/2011 |

* cited by examiner

*Primary Examiner* — Michelle Mandala
(74) *Attorney, Agent, or Firm* — Kilpatrick Townsend & Stockton LLP

(57) ABSTRACT

Methods of manufacturing a semiconductor device are provided. The method includes forming a preliminary mask pattern on an etch target layer. The preliminary mask pattern includes wave line type patterns, and each of the wave line type patterns includes main pattern portions and connection bar pattern portions. Node separation walls are formed on sidewalls of the preliminary mask patterns. The etch target layer is etched using the node separation walls as etch masks to form through holes penetrating the etch target layer. Nodes are formed in respective ones of the through holes.

20 Claims, 27 Drawing Sheets

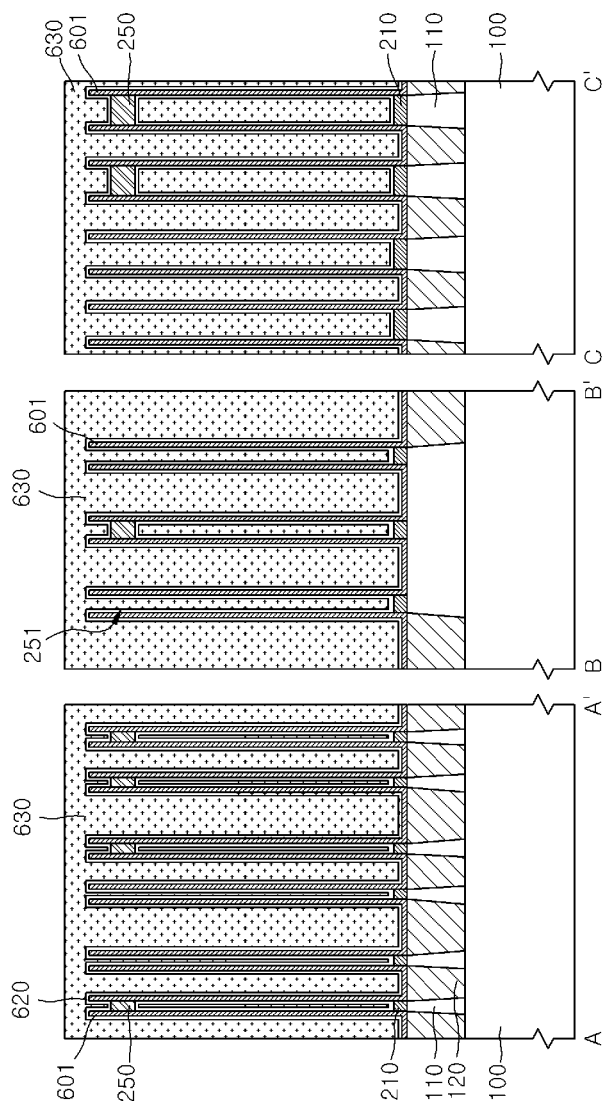

METHODS OF MANUFACTURING A SEMICONDUCTOR DEVICE HAVING A NODE ARRAY

CROSS-REFERENCE TO RELATED APPLICATION

The present application claims priority under 35 U.S.C 119(a) to Korean Application No. 10-2012-0095772, filed on Aug. 30, 2012, in the Korean Intellectual Property Office, which is incorporated herein by reference in its entirety as set forth in full.

BACKGROUND

Embodiments of the present disclosure relate to methods of manufacturing a semiconductor device and, more particularly, to methods of manufacturing a semiconductor device having a node array.

As semiconductor devices such as dynamic random access memory (DRAM) devices become more highly integrated and more shrunk, DRAM technologies have been continuously developed to realize a minimum feature size of about 20 nanometers or less. However, if the DRAM devices are scaled down, some elements such as storage nodes constituting memory cells of the DRAM devices may also be shrunk to reduce surface areas thereof. In such a case, cell capacitance of the DRAM cells may decrease to degrade cell characteristics, for example, a soft error rate (SER) characteristic. Thus, efforts to increase the cell capacitance of the DRAM devices in a limited area have been continuously required to realize high performance DRAM devices.

A unit memory cell of the DRAM devices may be configured to include a single cell capacitor and a single cell transistor. If the DRAM devices are scaled down, the cell capacitance of the DRAM cells may decrease to reduce a sensing margin of the DRAM cells. Thus, efforts to increase the cell capacitance of the DRAM devices have been continuously required together with shrink of the DRAM devices. In order to increase the cell capacitance of the DRAM cells in a limited area, a height of storage nodes constituting the DRAM cell capacitors may be increased. However, there may be limitations in increasing the height of the storage nodes using only process techniques.

The storage nodes may be formed by etching a mold layer to form through holes (e.g., storage node holes) penetrating the mold layer and by filling the through holes with a conductive material. Thus, a thickness of the mold layer should be increased to increase the height of the storage nodes. However, if the thickness of the mold layer increases, the burden on an etching process for forming the through holes may be increased. Accordingly, an etching margin of the etching process may be reduced and a contact margin between the storage nodes and the underlying cell transistors may also be reduced. That is, if the thickness of the mold layer increases, the through holes may not be fully opened. Further, when the mold layer is removed to expose sidewalls of the storage nodes, the storage nodes may easily lean or fall down. Therefore, it may be difficult to increase the height of the storage nodes. Thus, novel technologies are still required to increase surface areas of the storage modes without degradation of the integration density of the DRAM devices.

SUMMARY

Example embodiments are directed to methods of manufacturing a semiconductor device having a node array region.

According to some embodiments, a method of manufacturing a semiconductor device includes forming an etch target layer on a semiconductor substrate and forming a preliminary mask pattern on the etch target layer. The preliminary mask pattern is formed to have a planar shape corresponding to a design layout that includes wave line type patterns which are arrayed in parallel, and each of the wave line type patterns is formed to include a plurality of main pattern portions serially arrayed in each column and a plurality of connection bar pattern portions for connecting the plurality of main pattern portions in each column. Node separation walls are formed on sidewalls of the preliminary mask patterns to provide an array of main space portions which are defined at both sides of each of the connection bar pattern portions. The main pattern portions are removed to provide an array of additional space portions which are separated from the main space portions by the node separation walls. The etch target layer is etched using the node separation walls as etch masks to form an array of through holes penetrating the etch target layer. Nodes, which are disposed in respective ones of the through holes, are formed.

According to further embodiments, a method of manufacturing a semiconductor device includes forming an etch target layer on a semiconductor substrate and forming a preliminary mask pattern on the etch target layer. The preliminary mask pattern is formed to have a planar shape corresponding to a design layout that includes wave line type patterns which are arrayed in parallel, and each of the wave line type patterns is formed to include a plurality of main pattern portions serially arrayed in each column and a plurality of connection bar pattern portions for connecting the plurality of main pattern portions in each column. Node separation walls are formed on sidewalls of the preliminary mask patterns to provide an array of main space portions which are defined at both sides of each of the connection bar pattern portions. The main pattern portions are removed to provide an array of additional space portions which are separated from the main space portions by the node separation walls. The etch target layer is etched using the node separation walls as etch masks to form an array of through holes penetrating the etch target layer. Storage nodes are formed in respect ones of the through holes, and the etch target layer is removed. A dielectric layer and a plate node are sequentially formed on the storage nodes to form capacitors.

In some embodiments, the connection bar pattern portions may have a width which is less than a width of the main pattern portions.

In some embodiments, the wave line type patterns may be disposed such that bar space portions are defined between the main pattern portions arrayed in a direction which are perpendicular to the column, and a width of the bar space portions may be less than a width of the main space portions.

In some embodiments, the node separation walls may be formed to fill the bar space portions and to separate the main space portions arrayed in a direction parallel with the column from each other.

In some embodiments, the node separation walls may be formed to have a line width which is equal to or greater than half that of the bar space portions to fill the bar space portions.

In some embodiments, each of the main pattern portions may be designed to have a square shape, a rectangular shape, a circular shape, an oval shape, a diamond shape, or a cross shape.

In some embodiments, removing the main pattern portions may include etching the preliminary mask pattern using the node separation walls as etch masks, and the connection bar pattern portions sandwiched between the node separation walls may remain to separate the additional space portions arrayed in each column from each other when the main pattern portions are removed.

In some embodiments, the method may further include forming a main mask layer having an etch selectivity with respect to the node separation walls on the etch target layer prior to formation of the preliminary mask pattern and etching the main mask layer using the node separation walls as etch masks to form an main mask pattern.

In some embodiments, the main mask layer may be formed to include a silicon nitride layer, the node separation walls may be formed to include an ultra low temperature oxide (ULTO) layer, and the preliminary mask pattern may be formed to include a spin on carbon (SOC) layer.

In some embodiments, each of the through holes may be formed to have a diamond shape or an oval shape in a plan view due to the presence of the connection bar pattern portions.

In some embodiments, each of the nodes may be formed to have a cylindrical shape or a pillar shape.

In some embodiments, forming the preliminary mask pattern may include forming a preliminary mask layer on the etch target layer, designing one of the wave line type patterns such that a width of the connection bar pattern portion is less than a width of the main pattern portion, obtaining a design layout by repeatedly arraying the designed wave line type pattern in parallel such that regions between the main pattern portions of the arrayed wave line type patterns provide bar space portions which are narrower than a width of the main pattern portions, and transferring the design layout including the arrayed wave line type patterns onto the preliminary mask layer using a lithography process.

In some embodiments, the node separation walls may be formed to fill the bar space portions and to separate the main space portions arrayed in a direction parallel with the column from each other.

In some embodiments, removing the main pattern portions may include etching the preliminary mask pattern using the node separation walls as etch masks, and the connection bar pattern portions sandwiched between the node separation walls may remain to separate the additional space portions arrayed in each column from each other when the main pattern portions are removed.

In some embodiments, the method may further include forming a main mask layer having an etch selectivity with respect to the node separation walls on the etch target layer prior to formation of the preliminary mask pattern, and etching the main mask layer using the node separation walls as etch masks to form an main mask pattern.

In some embodiments, the method may further include forming a floating support layer on the etch target layer prior to formation of the preliminary mask pattern.

In some embodiments, removing the etch target layer may include etching portions of the floating support layer to form windows exposing portions of the etch target layer, and supplying an etchant for removing the etch target layer though the windows.

In some embodiments, forming the windows may include forming an etch mask layer covering the storage nodes, forming a floating support mask exposing portions of the etch mask layer on the etch mask layer, and etching the etch mask layer and the floating support layer using the floating support mask as an etch mask.

In some embodiments, forming the storage nodes may include conformally forming a storage node layer on the substrate having the through holes, forming protection patterns in respective ones of the through holes surrounded by the storage node layer, and removing portions of the storage node layer exposed by the protection patterns.

BRIEF DESCRIPTION OF THE DRAWINGS

Embodiments of the inventive concept will become more apparent in view of the attached drawings and accompanying detailed description, in which:

FIGS. 6, 7, 8, 10, 11, 13, 15, 16, 18, 19, 20, 22, 23, 25 and 27 are merged cross-sectional views taken along lines A-A', B-B' and C-C' of FIG. 2 that illustrate methods of manufacturing a semiconductor device according to some embodiments.

DETAILED DESCRIPTION OF THE EMBODIMENTS

Figure 1:
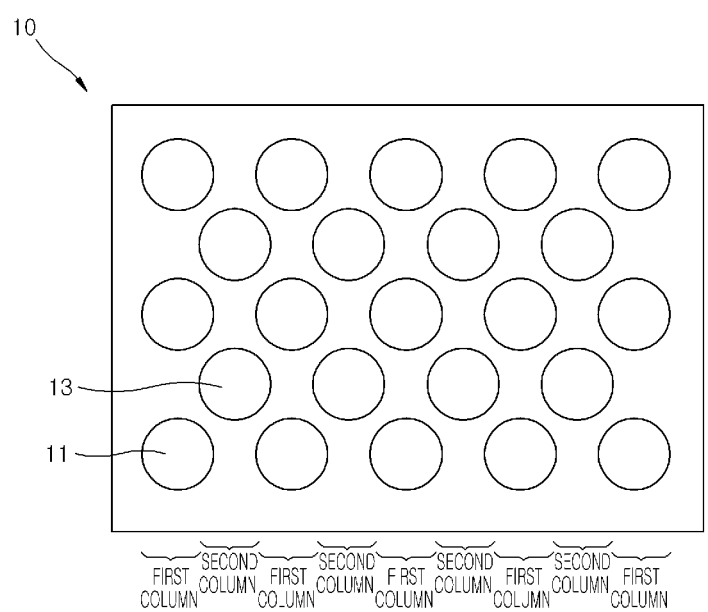
FIG. 1 is a layout illustrating a storage node array of cell capacitors of a semiconductor device according to some embodiments.

This application provides methods of manufacturing a semiconductor device. The method may include forming preliminary mask patterns on a semiconductor substrate using a pattern formation process that utilizes a preliminary photo mask having wave line type patterns which are arrayed to be spaced apart from each other, forming node separation walls having spacer shapes on sidewalls of the preliminary mask patterns, and forming main mask patterns using an etching process that utilizes the node separation walls as etching masks. The main mask patterns may be formed to define a node array. The wave line type patterns of the preliminary photo mask may be configured to include main patterns having relatively large critical dimensions (CDs) and connection bar patterns having relatively small CDs. The connection bar patterns may be disposed between the main patterns. Thus, each of the wave line type patterns may have sidewalls that exhibit wave line shapes on a plan view. That is, each of the wave line type patterns may be configured to include a plurality of dumbbell-shaped patterns or a plurality of dog bone-shaped patterns which are serially connected in a first direction when viewed from a plan view.

The connection bar patterns may affect images of the main patterns when the connection bar patterns and the main patterns of the preliminary photo mask are transferred onto a semiconductor substrate. That is, the images of the main patterns may be deformed because of the presence of the connection bar patterns between the main patterns when a photolithography process is performed using the preliminary photo mask. As a result, nodes (e.g., storage nodes) defined by the node separation walls or the main mask patterns may have oval shapes or diamond shapes in a plan view. If the nodes are defined to have oval shapes or diamond shapes, distances between the nodes which are arrayed in the first direction may be reduced to increase an integration density of the nodes and a surface area of each of the nodes. Thus, if the nodes correspond to storage nodes of the cell capacitors of the DRAM device, the cell capacitance of the DRAM device may be increased. When the nodes correspond to electrodes of cell storage elements of phase change random access memory (PCRAM) devices or resistive random access memory (ReRAM) devices, the integration density of the PCRAM devices or the ReRAM devices may be increased.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments. It will also be understood that when an element is referred to as being "on," "above", "below," or "under" another element, it can be directly "on," "above", "below," or "under" the other element, respectively, or intervening elements may also be present. Although the present application is described in conjunction with methods of manufacturing storage nodes of the DRAM devices, the embodiments may be equally applicable to any methods of manufacturing semiconductor device including nodes.

FIG. 1 is a layout illustrating a storage node array of cell capacitors of a semiconductor device according to some embodiments. A layout 10 of storage nodes may include first storage nodes 11 and second storage nodes 13 that constitute cell capacitors. The first and second storage nodes 11 and 13 of the cell capacitors may be densely arrayed on a limited area of a semiconductor substrate. The first storage nodes 11 may be arrayed in a first column, and the second storage nodes 13 may be arrayed in a second column. The first and second storage nodes 11 and 13 may be arrayed in a zigzag fashion along a first direction which is parallel with the first and second columns when viewed from a plan view. The first and second storage nodes 11 and 13 in the first and second columns may be repeatedly arrayed along a second direction perpendicular to the first direction, thereby constituting the storage node layout 10.

Figure 2:
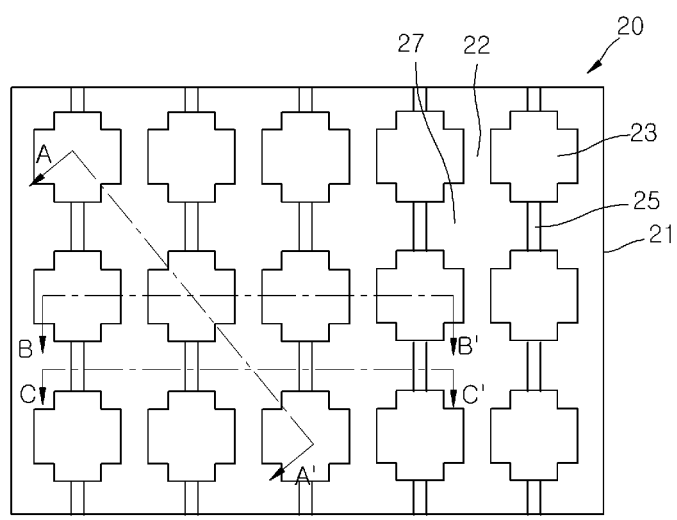
FIG. 2 illustrates a design layout of a preliminary mask for forming storage nodes of a semiconductor device according to some embodiments.

FIG. 2 illustrates a design layout of a preliminary mask for forming storage nodes of a semiconductor device according to some embodiments. A design layout 20 of a preliminary photo mask may be designed to include main pattern portions 23 corresponding to the first storage nodes 11 or the second storage nodes 13 which are shown in FIG. 1. For example, the design layout 20 may include the main pattern portions 23 corresponding to the first storage nodes 11 which are arrayed in the first columns of FIG. 1.

The main pattern portions 23 in each column may be connected by connection bar pattern portions 25. That is, the connection bar pattern portions 25 may be disposed between the main pattern portions 23 in each column. The main pattern portions 23 may have a relatively large CD as compared with the connection bar pattern portions 25. Thus, the main pattern portions 23 and the connection bar pattern portions 25 arrayed in each column may constitute a wave line type pattern when viewed from a plan view.

The wave line type pattern including the main pattern portions 23 and the connection bar pattern portions 25 disposed in one column may be repeatedly arrayed in a row direction which is perpendicular to the column, thereby constituting the design layout 20 of the preliminary mask. The design layout 20 may be used in fabrication of a photo mask for forming the storage nodes, and the main pattern portions 23 and the connection bar pattern portions 25 of the design layout 20 may be transferred onto an underlying layer 21. When the photo mask is fabricated to include a transparent substrate and an opaque layer (e.g., a chrome layer) on the transparent substrate, image features of the main pattern portions 23 and the connection bar pattern portions 25 may be formed of the chrome layer and the underlying layer 21 may correspond to the transparent substrate. When the photo mask is an extreme ultraviolet (EUV) mask, the image features may be formed of a light absorption layer and the underlying layer 21 may be formed of a light reflection layer.

Regions between the wave line type patterns (including the main pattern portions 23 and the connection bar pattern portions 25) may correspond to an array region of the second storage nodes 13 shown in FIG. 1. That is, main space portions 27 between the adjacent connection bar pattern portions 25 may provide images features of the second storage nodes 13, and bar space portions 22 between the adjacent main pattern portions 23 may be designed to connect the main space portions 27 disposed in each column.

In FIG. 1, the first storage nodes 11 may have substantially the same shapes as the second storage nodes 13. In such a case, the design layout 20 may be designed such that the main pattern portions 23 have substantially the same shapes as the main space portions 27 and the connection bar pattern portions 25 have substantially the same shapes as the bar space portions 22. The design layout 20 including the wave line type patterns may be transferred onto a semiconductor substrate to form preliminary mask patterns, and node separation walls having spacer shapes may be formed on sidewalls of the preliminary mask patterns to have spacer shapes. Thus, the bar space portions 22 may be formed to have a greater line width than the connection bar pattern portions 25 in consideration of a line width of the node separation walls formed on the sidewalls of the preliminary mask patterns. In such a case, the main space portions 27 may also be designed to have a greater horizontal width than the main pattern portions 23. For example, the bar space portions 22 may be designed to have a line width which is equal to or less than twice the line width of the node separation walls, and the connection bar pattern portions 25 may be designed to have a line width which is equal to or less than half the line width of the bar space portions 22.

Figure 3:
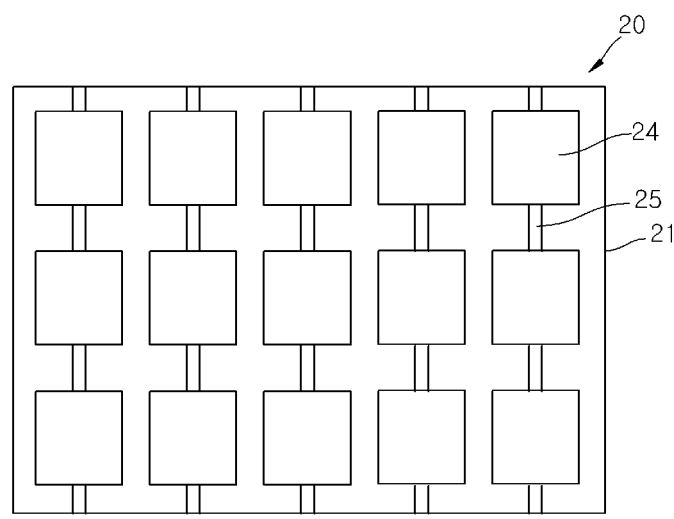
FIG. 3 illustrates another design layout of a preliminary mask for forming storage nodes of a semiconductor device according to some embodiments.
Figure 4:
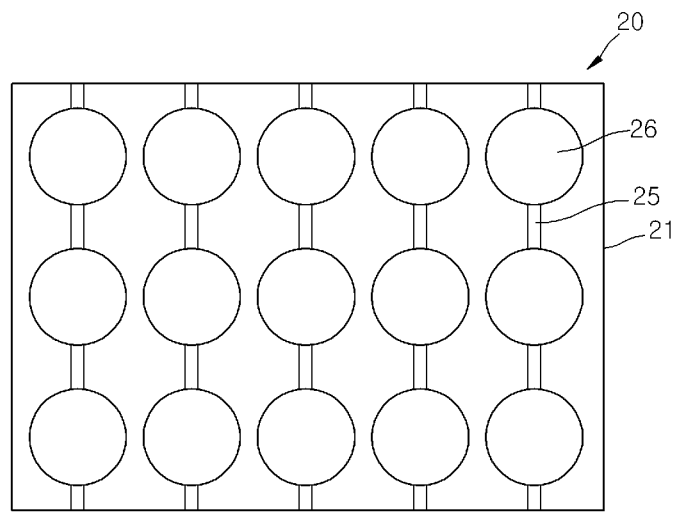
FIG. 4 illustrates still another design layout of a preliminary mask for forming storage nodes of a semiconductor device according to some embodiments.
Figure 5:
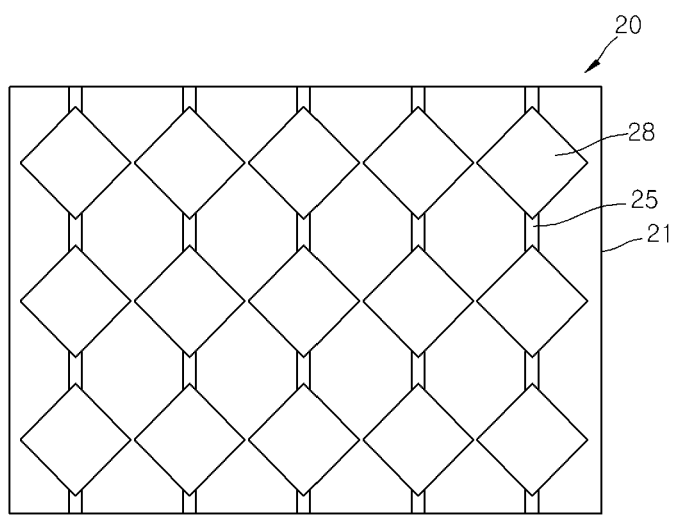
FIG. 5 illustrates yet another design layout of a preliminary mask for forming storage nodes of a semiconductor device according to some embodiments.

The design layout 20 of the preliminary mask may be obtained by designing the wave line type pattern including the main pattern portions 23 and the connection bar pattern portions 25 in one column and by repeatedly arraying the wave line type pattern to have a certain distance in a horizontal direction (e.g., a row direction) which is perpendicular to the column. In such a case, the width of the main pattern portions 23 may be different from the line width of the connection bar pattern portions 25, as described above. Thus, each wave line type pattern including the main pattern portions 23 and the connection bar pattern portions 25 may exhibit a plurality of dumbbell-shaped patterns or a plurality of dog bone-shaped patterns which are serially connected in one column when viewed from a plan view. Subsequently, a photo mask may be fabricated to have an image feature of the design layout 20, and preliminary mask patterns may be formed on a semiconductor substrate using a photolithography process that utilizes the photo mask. Each of the main pattern portions 23 may be designed to have a cross type configuration, as illustrated in FIG. 2. In such a case, the image pattern of each main pattern portion 23 transferred on the semiconductor substrate may have an oval shape, a diamond shape or the like (e.g., an annuli shape). In some embodiments, each of the main pattern portions 23 may be designed to have a square shape or a rectangular shape 24 (having a major axis which is parallel with the column direction), as illustrated in FIG. 3. In further embodiments, each of the main pattern portions 23 may be designed to have a circular shape 26 or an oval shape, as illustrated in FIG. 4. In further embodiments, each of the main pattern portions 23 may be designed to have a diamond shape 28, as illustrated in FIG. 5.

FIGS. 6, 7, 8, 10, 11, 13, 15, 16, 18, 19, 20, 22, 23, 25 and 27 are merged cross-sectional views taken along lines A-A', B-B' and C-C' of FIG. 2 that illustrate methods of manufacturing a semiconductor device according to some embodiments, and FIGS. 9, 12, 14, 17, 21, 24 and 26 are plan views illustrating methods of manufacturing a semiconductor device according to some embodiments.

Figure 6:
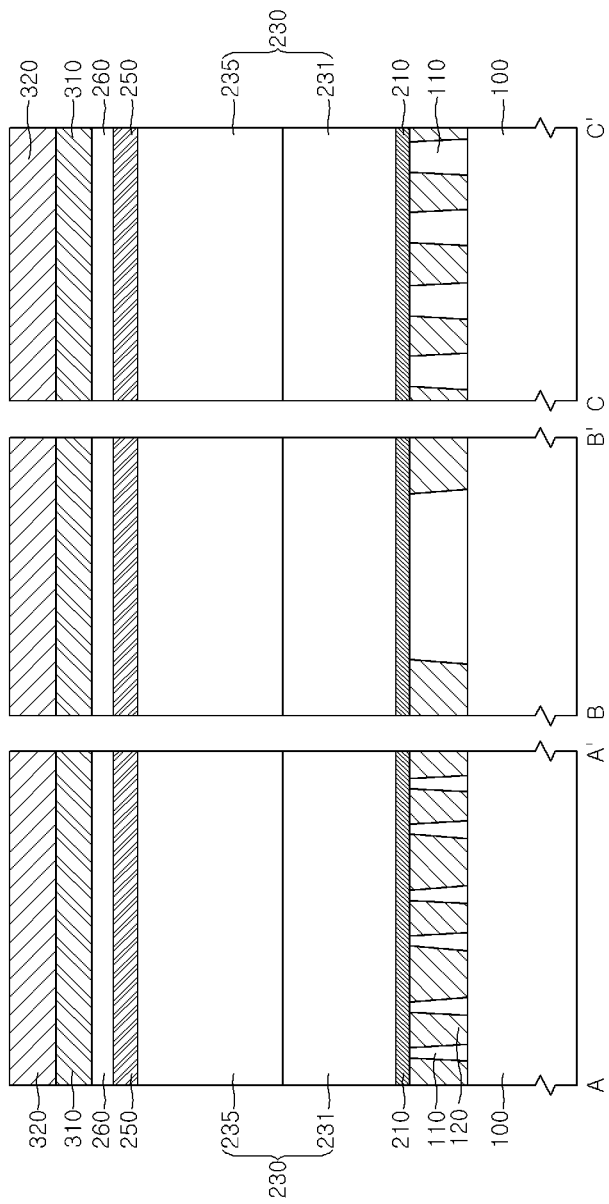

Referring to FIG. 6, a mold layer 230 may be formed on a semiconductor substrate 100, for example, a silicon substrate. The mold layer 230 may be etched to provide spaces in which storage node holes are formed in a subsequent process. The mold layer 230 may be formed of an etch target layer. When a semiconductor memory device such as a DRAM device is formed on the semiconductor substrate 100, cell transistors (not shown) together with cell capacitors constitute memory cells of the DRAM device. In some embodiments, the cell transistors may be formed, at least partially, in the semiconductor substrate 100.

Specifically, an insulation layer 110 may be formed to cover the cell transistors, and contact plugs 120 may be formed in the insulation layer 110. The contact plugs 120 may be formed to penetrate the insulation layer 110 and may be electrically connected to the cell transistors. Each of the contact plugs 120 may be formed to include a conductive layer such as a doped polysilicon layer. The contact plugs 120 may be formed to electrically connect the cell transistors to storage nodes which are formed in subsequent processes.

The mold layer 230 (231+235) may be formed on surfaces of the contact plugs 120 and the insulation layer 110 which are opposite to the semiconductor substrate 100. In some embodiments, an etch stop layer 210 may be formed at an interface between the mold layer 230 the insulation layer 110. The etch stop layer 210 may be formed on the contact plugs 120 and the insulation layer 110 prior to formation of the mold layer 230. The etch stop layer 210 may be formed to protect the insulation layer 110 from being etched when the mold layer 230 is removed using a wet etch process (e.g., a dip out process) after formation of storage nodes penetrating the mold layer 230 in a subsequent process. Further, the etch stop layer 210 may provide an end point of an etch process even when the mold layer 230 is etched to form through holes in which the storage nodes are formed. Thus, the etch stop layer 210 may be formed of an insulation material having an etch selectivity with respect to the mold layer 230. For example, when the mold layer 230 is formed of a silicon oxide layer, the etch stop layer 210 may be formed to include a silicon nitride layer. The etch stop layer 210 may be formed to have a thickness of about 200 angstroms to about 1000 angstroms.

In the event that the etch stop layer 210 is formed on the insulation layer 110, the mold layer 230 may be formed on a surface of the etch stop layer 210 opposite to the insulation layer 110. The mold layer 230 may be formed of a double layered material including a first mold layer 231 containing phosphorous silicate glass (PSG) and a second mold layer 235 containing plasma enhanced tetra-ethyl-ortho-silicate (PE-TEOS). The first and second mold layers 231 and 235 may be a silicon oxide based material, but the first and second mold layers 231 and 235 may be formed of material layers having different etch rates from each other. A PSG material may have a higher etch rate than a PE-TEOS material in the same oxide etchant. Thus, if the mold layer 230 is formed to include a PSG layer and a PE-TEOS layer sequentially stacked, it may be easy to selectively enlarge lower widths of the through holes. As described above, the mold layer 230 may be formed by sequentially staking two material layers, but the embodiments may not be limited thereto. For example, the mold layer 230 may be formed of a single material layer. A total thickness of the mold layer 230 may be determined according to a height of storage nodes which are formed in a subsequent process. That is, the total thickness of the mold layer 230 may relate to a cell capacitance. In some embodiments, the mold layer 230 may be formed to have a total thickness of about 10000 angstroms to about 14000 angstroms.

A floating support layer 250 may be formed on the mold layer 230. The floating support layer 250 may be patterned in a subsequent process, and the patterned support layer may be disposed between tall storage nodes to prevent the tall storage nodes from leaning or falling down. The floating support layer 250 may be formed to include a material layer having an etch selectivity with respect to the mold layer 230. For example, the floating support layer 250 may be formed of a silicon nitride layer having a thickness of about 200 angstroms to about 1000 angstroms.

A buffer layer 260 may be formed on a surface of the floating support layer 250 opposite to the mold layer 230. The buffer layer 260 may be formed to minimize damage of the floating support layer 250 or damage of upper portions of storage nodes during a subsequent etch process for forming through holes penetrating the mold layer 230 and/or during a subsequent dip out process for removing the mold layer 230. The buffer layer 260 may act as a protection layer that protects the floating support layer 250 and may be formed to include a silicon oxide layer such as a PE-TEOS layer.

A main mask layer 310 may be formed on a surface of the buffer layer 260 opposite to the floating support layer 250. The main mask layer 310 may be patterned in a subsequent process and the patterned main mask layer may be used as a substantial etch mask during an etch process for forming through holes penetrating the mold layer 230. That is, the main mask layer 310 may correspond to a hard mask layer. The main mask layer 310 may be formed of a material layer having an etch selectivity with respect to the mold layer 230. For example, the main mask layer 310 may be formed to include a silicon nitride layer having a thickness of several hundreds of angstroms to several thousands of angstroms.

A preliminary mask layer 320 may be formed on a surface of the main mask layer 310 opposite to the buffer layer 260. In a subsequent process, the preliminary mask layer 320 may be patterned to provide a step difference which is used in formation of node separation walls having a spacer shape. The preliminary mask layer 320 may be formed of a material layer having an etch selectivity with respect to the main mask layer 310 and may be used as a sacrificial layer. For example, the preliminary mask layer 320 may be formed by coating a spin on carbon (SOC) material. In such a case, the SOC material may be formed to have a thickness of about several hundreds of angstroms to about several thousands of angstroms. Although not shown in the drawings, a protection layer may be additionally formed on a surface of the preliminary mask layer 320 (e.g., an SOC layer) opposite to the main mask layer 310. The protection layer may be formed to easily separate a photoresist pattern formed on the SOC layer in a subsequent process from the SOC layer. Further, the protection layer may act as an anti-reflective layer during an exposure step of a lithography process. In some embodiments, the protection layer may be formed of a silicon oxynitride (SiON) layer.

Figure 7:
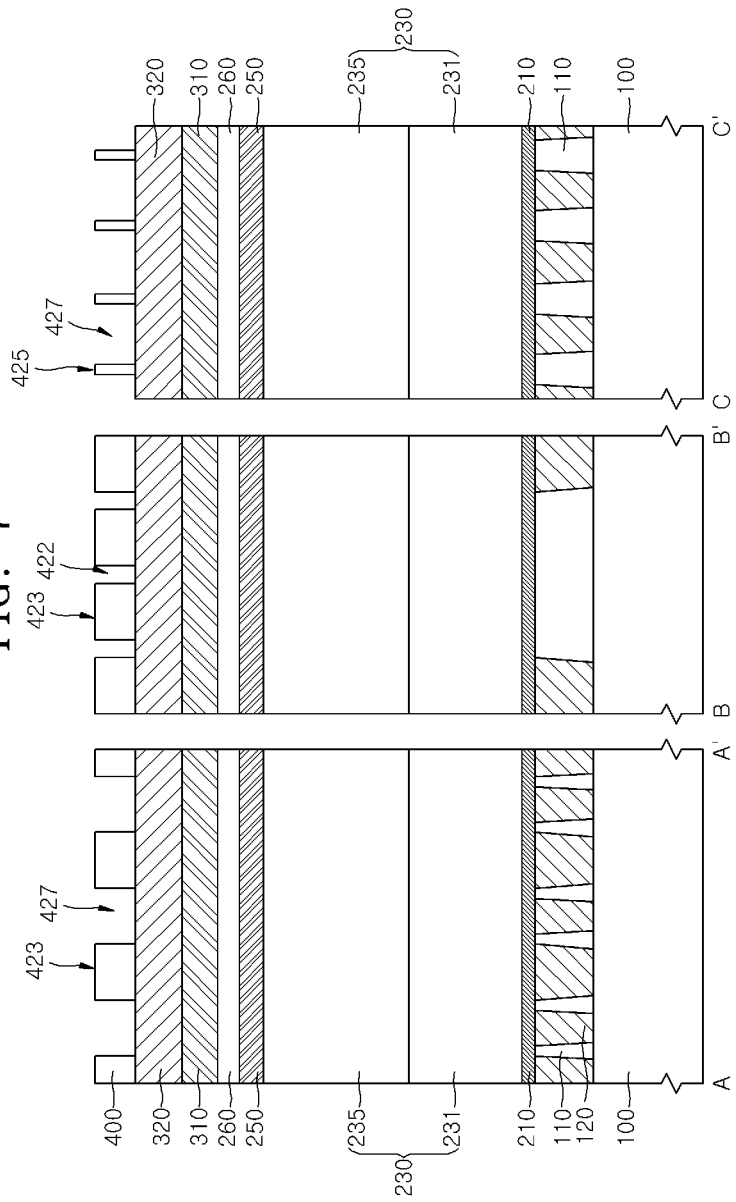

Referring to FIG. 7, a resist pattern 400 on which the design layout 20 of FIG. 2 is transferred may be formed on the preliminary mask layer 320. Specifically, a photoresist layer may be formed on the preliminary mask layer 320, and a lithography process including an exposure step and a development step may be applied to the photoresist layer to form a resist pattern 400. Thus, resist pattern 400 may have a plurality of patterns corresponding to the design layout 20 of FIG. 2. That is, a photo mask may be fabricated using the design layout 20 of FIG. 2, and an exposure step may be applied to the photoresist layer using the photo mask to transfer the image of the design layout 20 of FIG. 2 onto the photoresist layer.

As a result of the lithography process applied to the photoresist layer, the resist pattern 400 may be formed to include main pattern portions 423 corresponding to the main pattern portions 23 of the design layout 20 of FIG. 2, main space portions 427 corresponding to the main space portions 27 of the design layout 20 of FIG. 2, connection bar pattern portions 425 corresponding to the connection bar pattern portions 25 of the design layout 20 of FIG. 2, and bar space portions 422 corresponding to the bar space portions 22 of the design layout 20 of FIG. 2.

Figure 8:
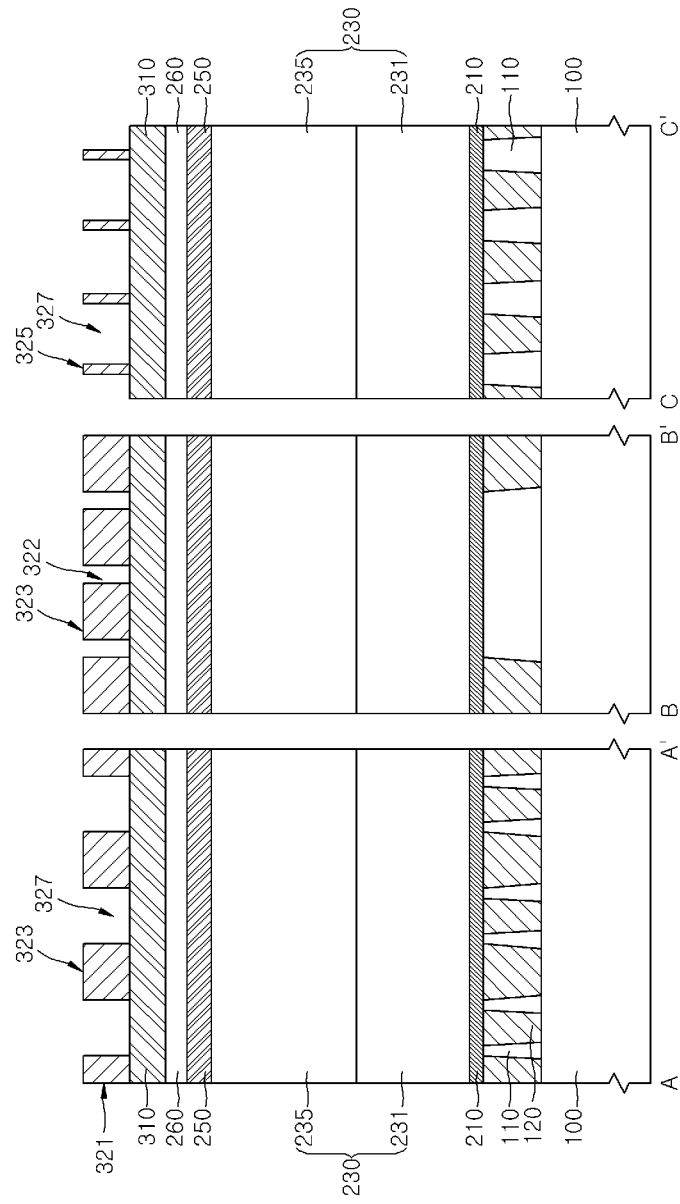
Figure 9:
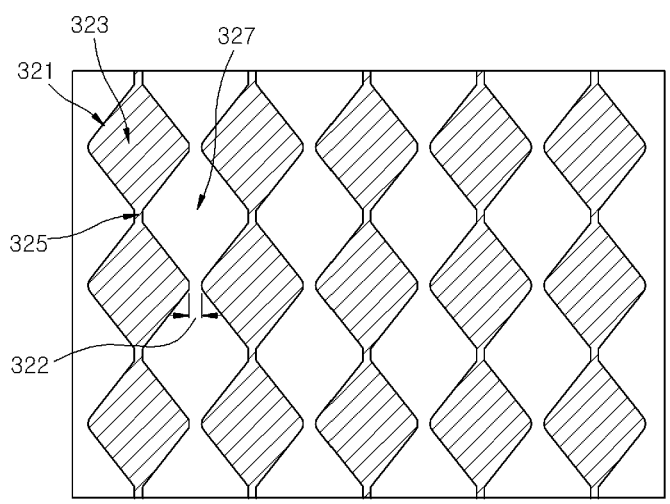
FIGS. 9, 12, 14, 17, 21, 24 and 26 are plan views illustrating methods of manufacturing a semiconductor device according to some embodiments.

Referring to FIGS. 8 and 9, the preliminary mask layer 320 may be etched using the resist pattern 400 as an etch mask, thereby forming a preliminary mask pattern 321. Thus, a planar shape of the preliminary mask pattern 321 may depend on a planar shape of the resist pattern 400. That is, the preliminary mask pattern 321 may be formed to include main pattern portions 323 corresponding to the main pattern portions 423 of the resist pattern 400, main space portions 327 corresponding to the main space portions 427 of the resist pattern 400, connection bar pattern portions 325 corresponding to the connection bar pattern portions 425 of the resist pattern 400, and bar space portions 322 corresponding to the bar space portions 422 of the resist pattern 400.

When the preliminary mask layer 320 is patterned by a lithography process and an etch process with the photo mask having the design layout 20 of FIG. 2, edge corners of the pattern portions 323, 327, 322 and 325 of the preliminary mask pattern 321 may be trimmed or rounded due to an optical proximity effect (OPE) and the etch process. Thus, the main pattern portions 323 and the main space portions 327 of the preliminary mask pattern 321 may be formed to have a diamond shape when viewed from a plan views. That is, even though each of the main pattern portions 23 of the design layout 20 of FIG. 2 is designed to have a cross type configuration, the main pattern portions 323 and the main space portions 327 of the preliminary mask pattern 321 may be formed to have a diamond shape because of an optical proximity effect (OPE) and an etch process when viewed from a plan views.

As illustrated in FIG. 2, each of the connection bar pattern portions 25 may be disposed between two adjacent main pattern portions 23 arrayed in one column. Thus, the main pattern portions 323 and/or the main space portions 327 of the preliminary mask pattern 321 may be formed to extend in a first direction, which is parallel with columns, due to the optical proximity effect (OPE). That is, the main pattern portions 323 and/or the main space portions 327 of the preliminary mask pattern 321 may be formed such that a first maximum width of each main pattern portion 323 (or each main space portion 327) in the first direction is greater than a second maximum width of each main pattern portion 323 (or each main space portion 327) in a second direction perpendicular to the first direction. When the edge corners of the pattern portions 323, 327, 322 and 325 of the preliminary mask pattern 321 are more severely trimmed or rounded due to an optical proximity effect (OPE) and the etch process, the main pattern portions 323 and the main space portions 327 of the preliminary mask pattern 321 may be formed to be close to an oval shape rather than a diamond shape in a plan view. As a result, each of the main pattern portions 323 and/or the main space portions 327 of the preliminary mask pattern 321 may be formed to have a major axis and a minor axis which is less than the major axis.

Figure 10:
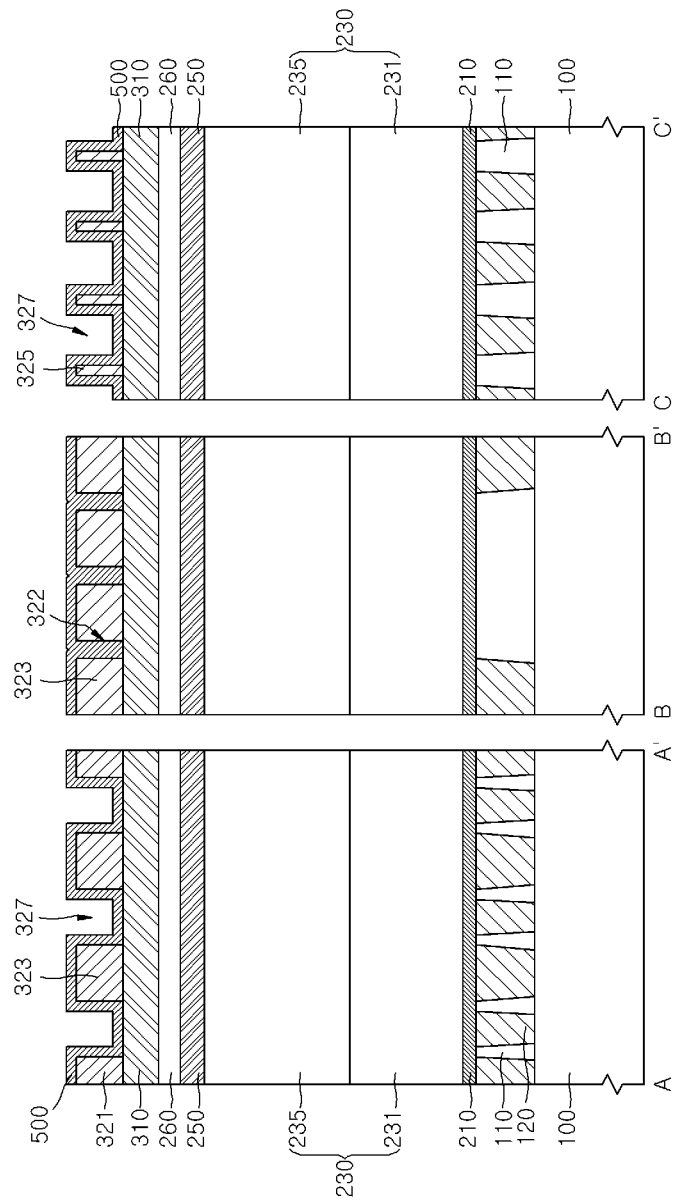

Referring to FIG. 10, a node separation wall layer 500 may be formed on the preliminary mask pattern 321 and the main mask layer 310. The node separation wall layer 500 may be formed to include an insulation layer having an etch selectivity with respect to the preliminary mask pattern 321 and the main mask layer 310. In some embodiments, the node separation wall layer 500 may be formed to include a silicon oxide layer. For example, the node separation wall layer 500 may be formed to include an ultra low temperature oxide (ULTO) layer. The connection bar pattern portions 325 of the preliminary mask pattern 321 may be formed to have a narrow line width of about several tens of angstroms to about several hundreds of angstroms, and the bar space portions 322 of the preliminary mask pattern 321 may also be formed to have a narrow line width of about several tens of angstroms to about several hundreds of angstroms. The ULTO layer may exhibit an excellent filing characteristic. Thus, the ULTO layer may be suitable for the node separation wall layer 500.

Figure 11:
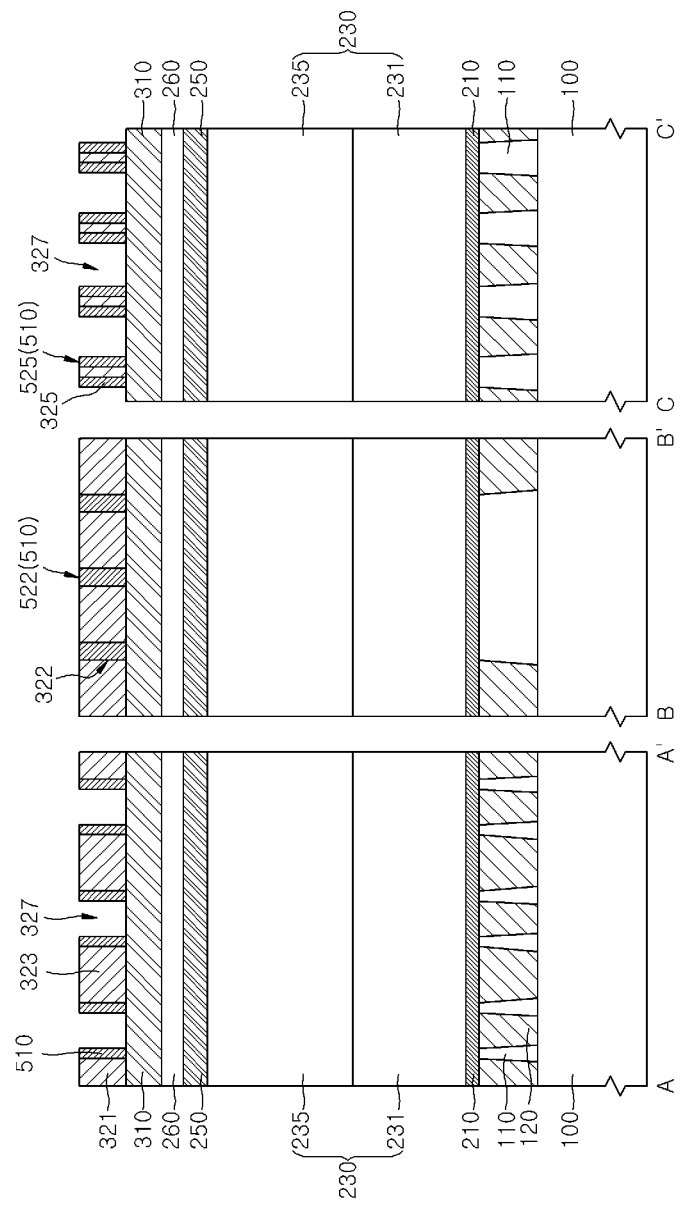
Figure 12:
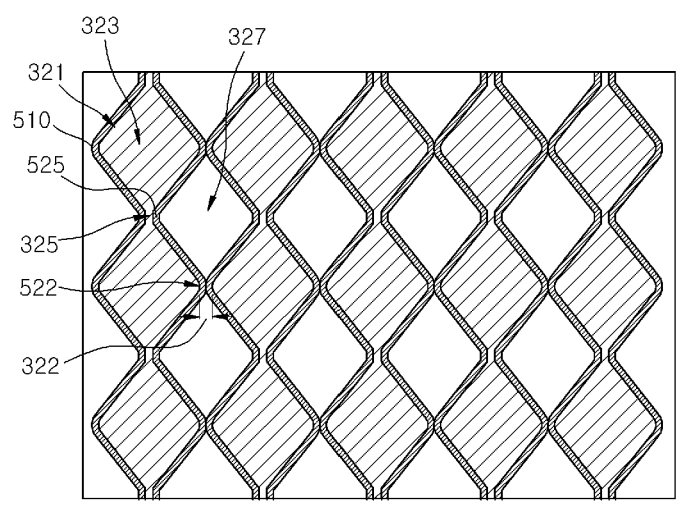

Referring to FIGS. 11 and 12, the node separation wall layer 500 may be etched back or anisotropically etched to form node separation walls 510 on sidewalls of the preliminary mask pattern 321. In such a case, the node separation walls 510 may be formed to have a spacer shape. After formation of the node separation walls 510, a top surface of the preliminary mask pattern 321 and portions of a top surface of the main mask layer 310 may be exposed. First portions 522 of the node separation walls 510 may fill the bar spaces 322 of the preliminary mask pattern 321 to separate the main space portions 327 arrayed in each column from each other. Further, second portions 525 of the node separation walls 510 formed on both sidewalls of the connection bar pattern portions 325 may sandwich the connection bar pattern portions 325 between the second portions 525 such that the connection bar pattern portions 325 remain even in subsequent processes.

Figure 13:
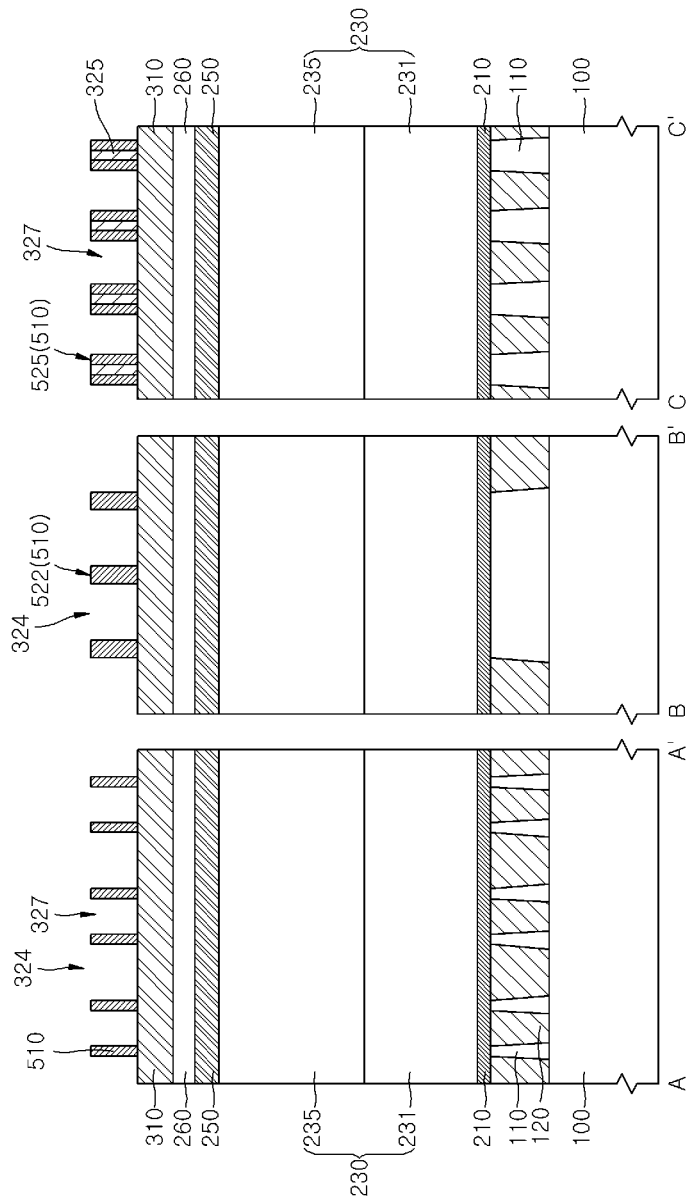
Figure 14:
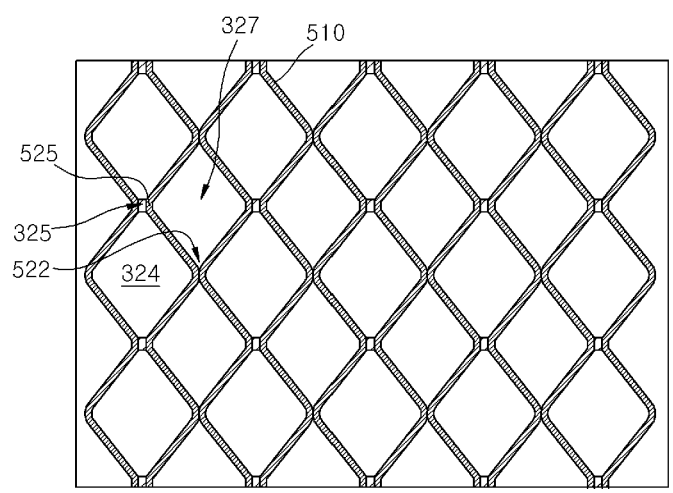

Referring to FIGS. 13 and 14, the preliminary mask pattern 321 may be selectively removed using the node separation walls 510 as etch masks. When the preliminary mask pattern 321 is formed of a carbon based layer such as an SOC layer, the preliminary mask pattern 321 may be removed using an etch process that employs oxygen plasma as an etch gas. In such a case, the connection bar pattern portions 325 sandwiched between the second portions 525 of the node separation walls 510 may still remain even when the preliminary mask pattern 321 is removed. This is because the connection bar pattern portions 325 exist in narrow spaces having a width of about several tens of angstroms to about several hundreds of angstroms, which are defined by the adjacent second portions 525 of the node separation walls 510. That is, even though the etch process for removing the preliminary mask pattern 321 is performed, the connection bar pattern portions 325 may still remain due to a capillary phenomenon.

The remained connection bar pattern portions 325 and the second portions 525 of the node separation walls 510 may separate additional space portions 324, which are opened by removal of the main pattern portions 323 in each column, from each other. As a result, the node separation walls 510 and the remained connection bar pattern portions 325 may provide a plurality of separate openings including the additional space portions 324 and the main space portions 327. Each of the separate openings may have an hole shape. Accordingly, the holes including the additional space portions 324 and the main space portions 327 may be substantially separated from each other by the node separation walls 510. Thus, since the holes may be densely arrayed in a limited area of the semiconductor substrate 100, an area of each hole may be maximized.

Figure 15:
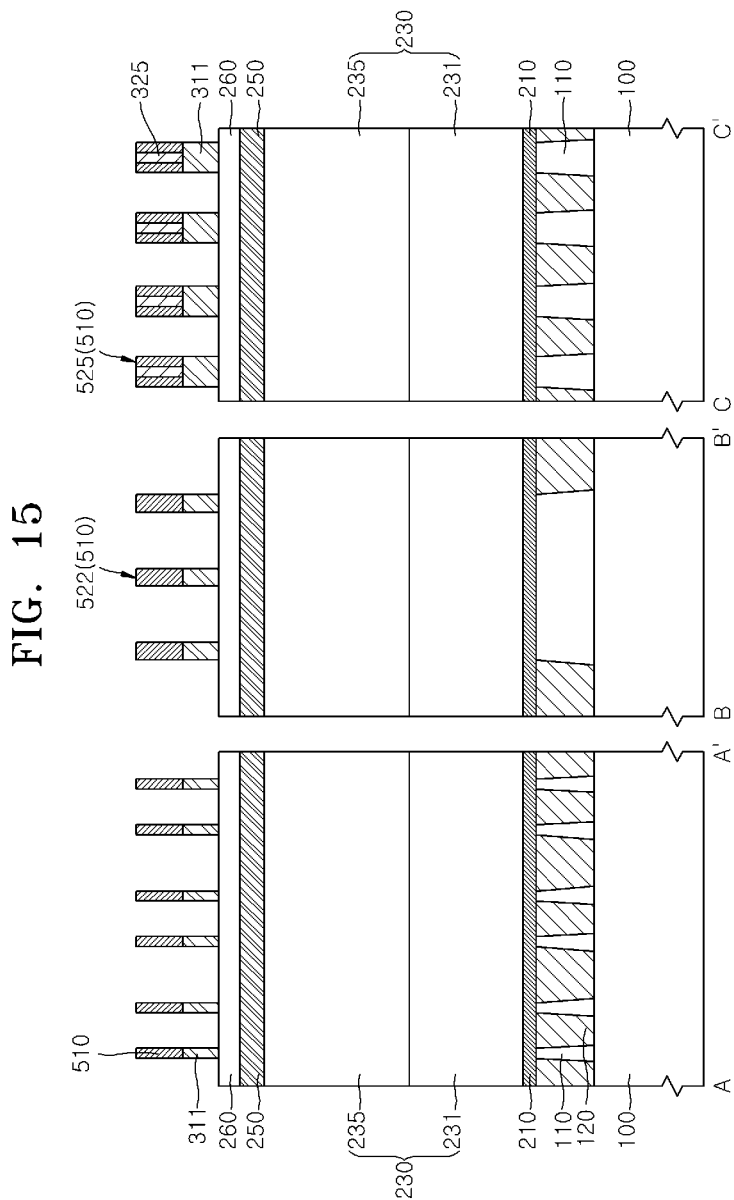

Referring to FIG. 15, the main mask layer (310 of FIG. 13) may be etched using the node separation walls 510 and the remained connection bar pattern portions 325 as etch masks, thereby forming a main mask pattern 311 having substantially the same planar shape as a pattern composed of the node separation walls 510 and the remained connection bar pattern portions 325.

Figure 16:
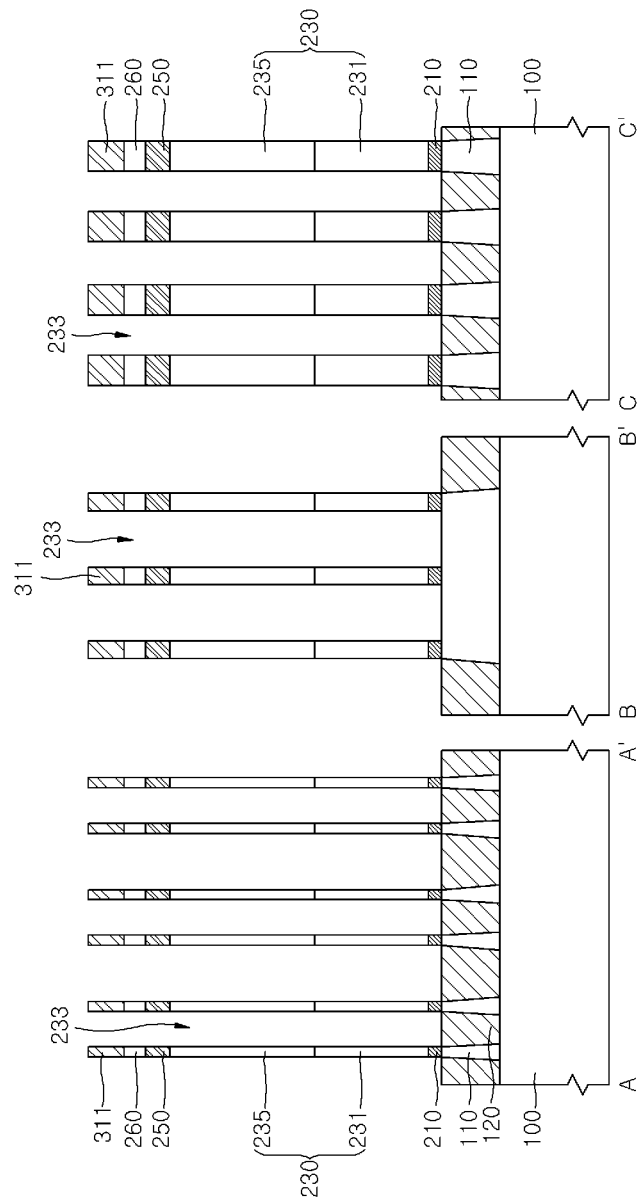
Figure 17:
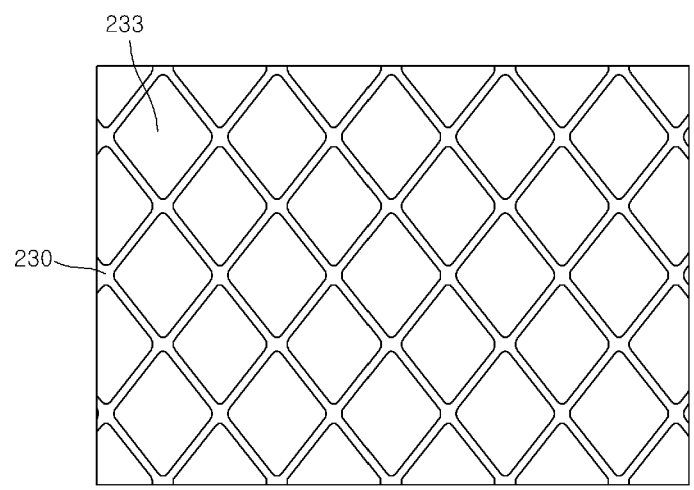

Referring to FIGS. 16 and 17, the buffer layer 260 and the floating support layer 250 may be etched using the main mask pattern 311 as an etch mask. Subsequently, the mold layer 230 may be etched using the main mask pattern 311 as an etch mask, thereby forming through holes 233 that penetrate the mold layer 230. When the through holes 233 are formed, the etch stop layer 210 may provide an end point of the etch process for forming the through holes 233. Further, the etch stop layer 210 may be additionally etched to form final through holes 233 exposing the contact plugs 120.

Figure 18:
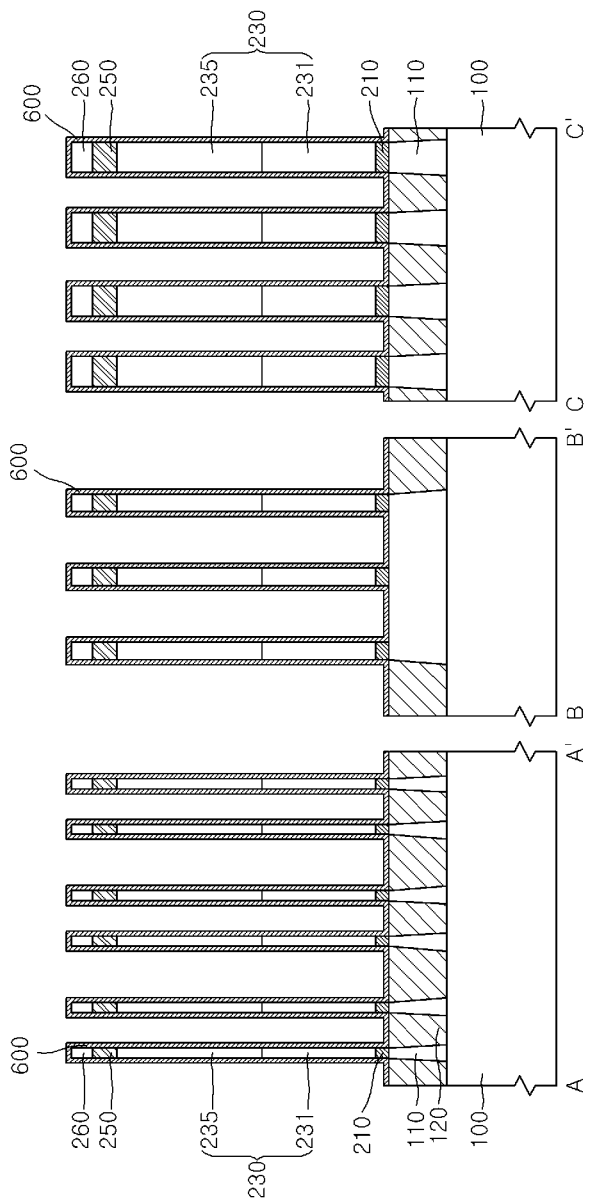

Referring to FIG. 18, the main mask pattern (311 of FIG. 16) may be selectively removed, and a conductive layer, for example, a metal layer such as a titanium nitride (TiN) layer may be deposited in the through holes 233 to form a storage node layer 600. The storage node layer 600 may be conformally formed to include a plurality of cylinder-shaped portions in respective ones of the through holes 233 in order to increase surface areas of storage nodes which are formed in subsequent processes, but not limited thereto. For example, the storage node layer 600 may be formed to fill the through holes 233. In such a case, storage nodes may be formed to have pillar shapes in subsequent processes. In the event that the semiconductor device formed on the semiconductor substrate 100 corresponds to a PCRAM device or an ReRAM device, the storage nodes in the through holes 233 may be formed to have pillar shapes and may be used as lower nodes of variable resistive elements of the PCRAM device or the ReRAM device.

Figure 19:
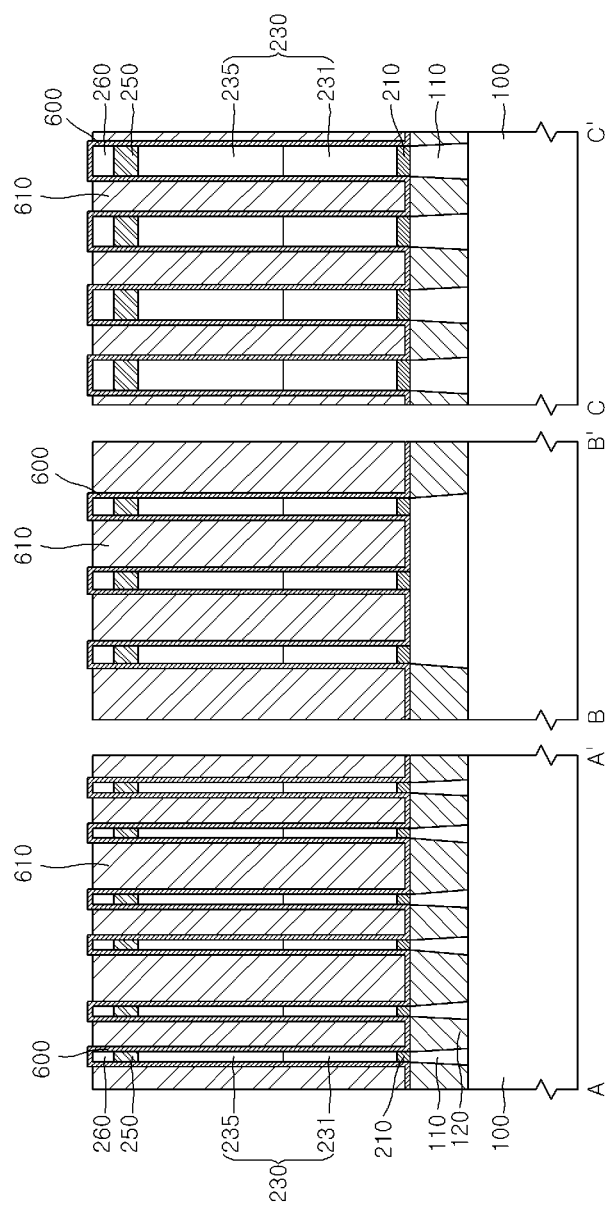

Referring to FIG. 19, protection patterns 610 may be formed in respective ones of the through holes 233 surrounded by the storage node layer 600. The protection patterns 610 may be formed to protect the storage node layer 600 in the through holes 233 during a subsequent etch process for forming storage nodes which are separated from each other. In some embodiments, the protection patterns 610 may be formed by coating an SOC layer on the storage node layer 600 to fill the through holes 233 and by etching back the SOC layer to expose portions of the storage node layer 600 on the buffer layer 260.

Figure 20:
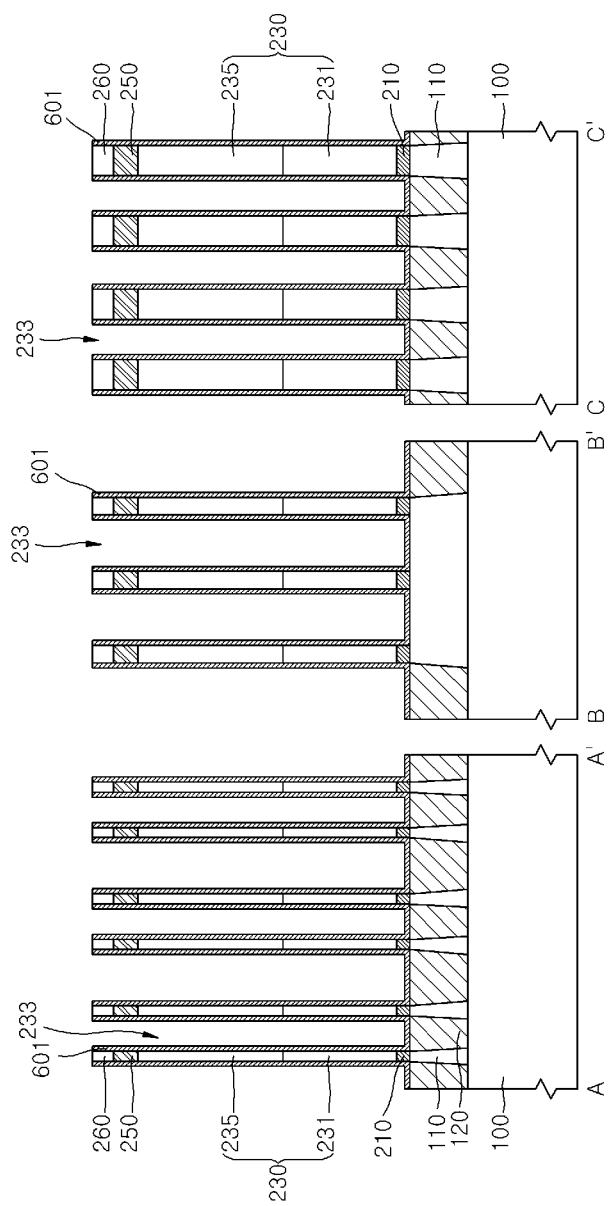
Figure 21:
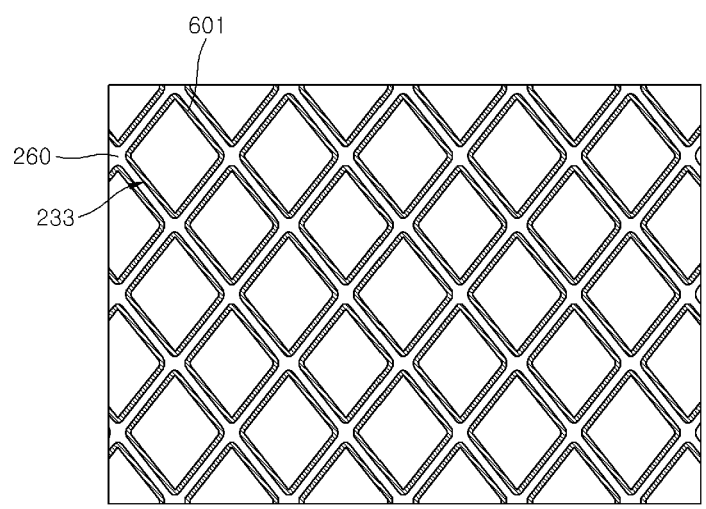

Referring to FIGS. 20 and 21, the exposed portions of the storage node layer 600 may be selectively etched or removed to form separate storage nodes 601 in respective ones of the through holes 233. This node separation process may be performed using a planarization process such as an etching back process or a chemical mechanical polishing (CMP) process. Subsequently, the protection patterns 610 in the through holes 233 may be removed to expose the storage nodes 601.

Figure 22:
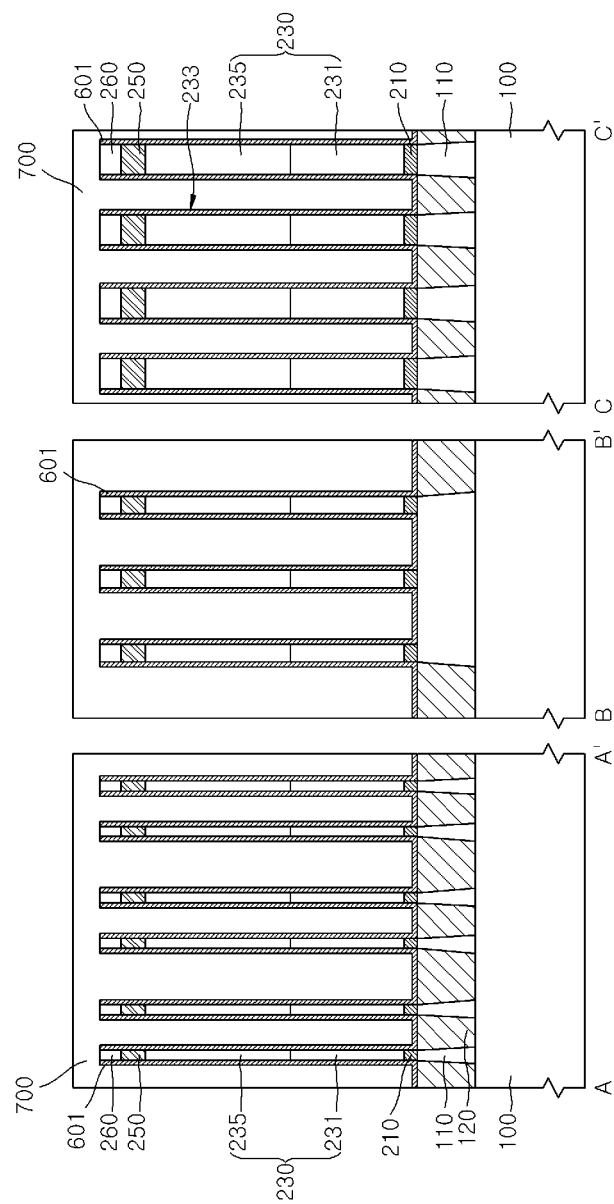

Referring to FIG. 22, an etch mask layer 700 may be formed on the substrate where the protection patterns 610 are removed. The etch mask layer 700 may be formed to include the same material layer as the mold layer 230. This is for simultaneously removing the etch mask layer 700 and the mold layer 230 when the mold layer 230 is removed using a dip out process in a subsequent process. Thus, when the mold layer 230 is formed of a silicon oxide layer, the etch mask layer 700 may also be formed to include a silicon oxide layer.

Figure 23:
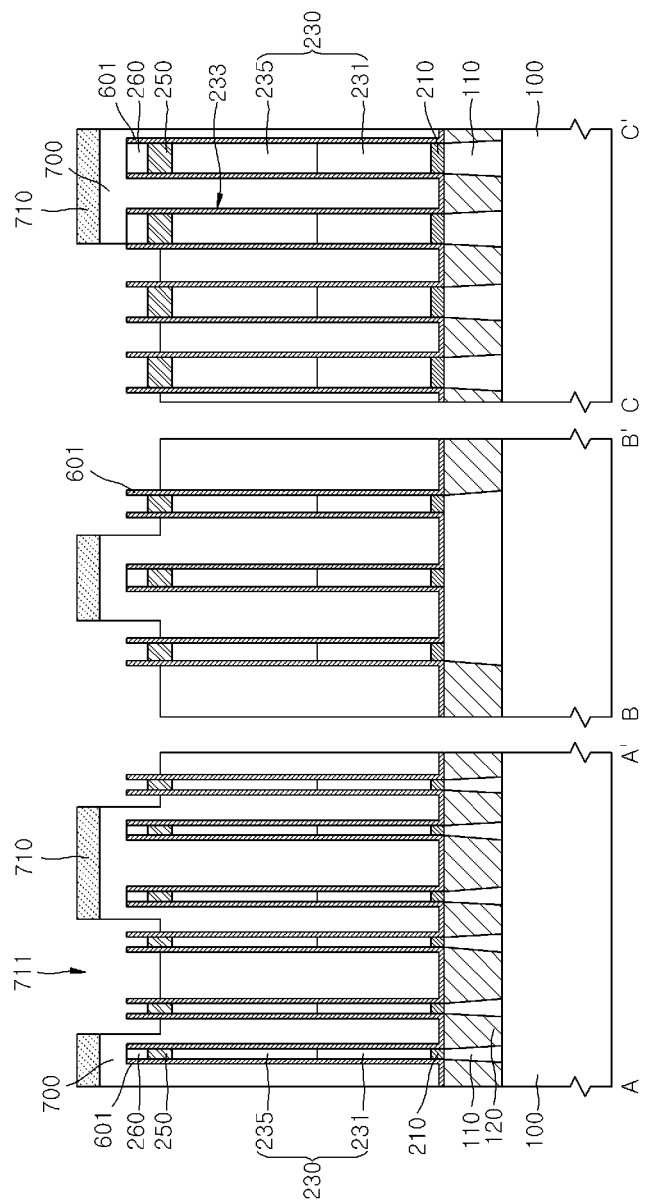
Figure 24:
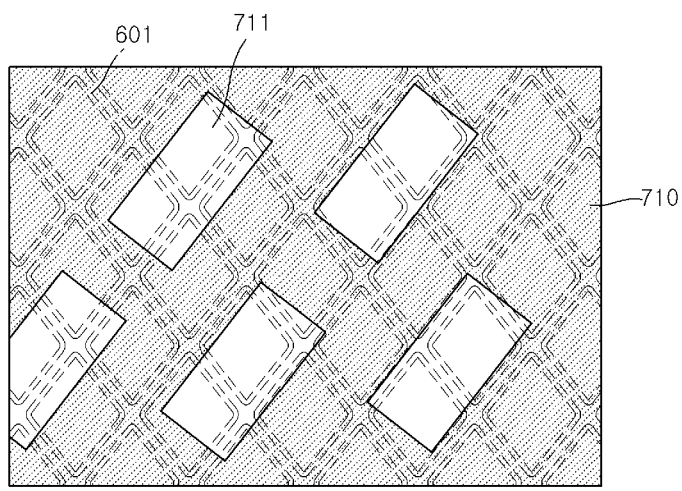

Referring to FIGS. 23 and 24, a floating support mask 710 may be formed on the etch mask layer 700. The floating support mask 710 may be formed to have first windows 711 which are disposed over portions of the floating support layer 250. The floating support mask 710 may be formed of a photoresist layer. That is, the floating support mask 710 may be formed by coating a photoresist layer on the etch mask layer 700 and by patterning the photoresist layer using a lithography process.

The etch mask layer 700 and the buffer layer 260 may be etched using the floating support mask 710 as an etch mask until portions of the floating support layer 250 are exposed.

Figure 25:
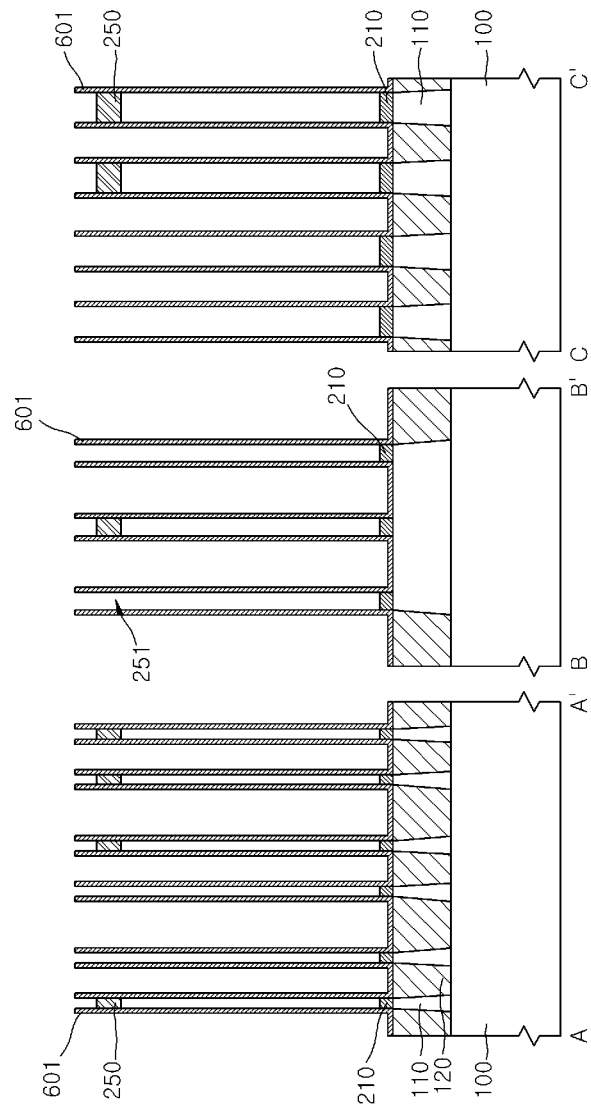
Figure 26:
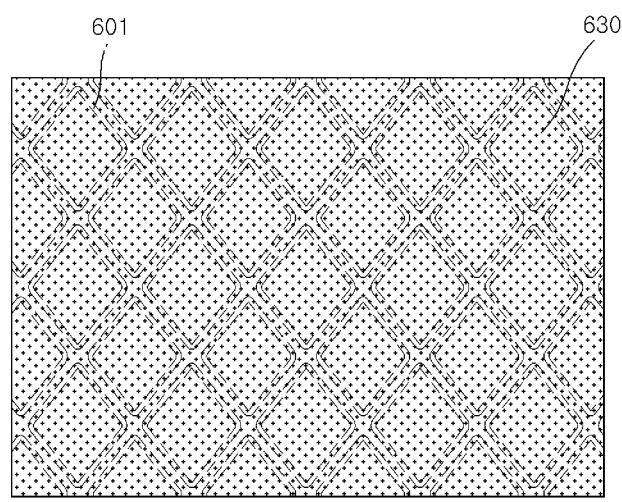

Referring to FIGS. 25 and 26, the exposed floating support layer 250 may be etched using the etch mask layer (700 of FIG. 23) as an etch mask, thereby forming second windows 251 that expose portions of the mold layer (230 of FIG. 23). The mold layer 230 may then be removed by supplying a wet etchant through the second windows 251 using a wet etch process such as a dip out process. During removal of the mold layer 230, the etch mask layer 700 may also be removed to expose outer sidewall surfaces of the storage nodes 601 which are fixed by the floating support layer 250. When the mold layer 230 and the etch mask layer 700 are removed, the etch stop layer 210 may protect the underlying insulation layer 110 from the etchant of the wet etch process for removing the mold layer 230. Thus, the etch stop layer 210 may prevent the insulation layer 110 from being damaged or etched during removal of the mold layer 230.

Referring to FIG. 27, a dielectric layer 620 may be formed to cover surfaces of the storage nodes 601. The dielectric layer 620 may be formed of a high-k dielectric layer having a high dielectric constant. For example, the dielectric layer 620 may be formed to include at least one of a zirconium oxide ($ZrO_2$) layer, an aluminum oxide ($Al_2O_3$) layer and a tantalum oxide ($Ta_2O_5$) layer. A plate node 630 may then be formed on the dielectric layer 620. The storage nodes 601, the dielectric layer 620 and the plate node 630 may constitute cell capacitors. The plate node 630 may be formed to include a titanium nitride (TiN) layer. In some embodiments, the plate node 630 may be formed to include at least one selected from the group consisting of a metal layer, a metal nitride layer and a conductive metal oxide layer. For example, the plate node 630 may be formed to include at least one selected from the group consisting of a tantalum nitride (TaN) layer, a zirconium nitride (ZrN) layer, a tungsten nitride (WN) layer, a ruthenium (Ru) layer, a ruthenium oxide ($RuO_2$) layer, an iridium (Ir) layer, an iridium oxide ($IrO_2$) layer, a platinum (Pt) layer and a strontium ruthenium oxide ($SrRuO_3$) layer.

According to the embodiments described above, a node array including the storage nodes 601 may be patterned to be self-aligned with the node separation walls 510. Further, because the storage nodes 601 are substantially separated from each other by the node separation walls 510 having a spacer shape, a distance between the storage nodes 601 may be minimized. As described above, adjacent storage nodes 601 are separated by a distance determined by spacer 510 in FIG. 11, which in turn is determined by the thickness of the deposited thin film of node separation wall layer 500 in FIG. 10. Since the thickness of a deposited thin film can be much thinner than the minimum geometry achievable using lithographic patterning techniques, the separation between adjacent nodes can be much smaller in embodiments of this invention than in conventional methods. Thus, an area (a planar area) that the storage nodes 601 occupy in a limited area may be maximized. Accordingly, an aspect ratio of the storage nodes 601 may be reduced to suppress a leaning phenomenon of the storage nodes 601. Moreover, lower widths of the storage nodes 601 may be enlarged to increase the capacitance of the cell capacitors including the storage nodes 601 and to reduce the contact resistance between the storage nodes 601 and the underlying contact plugs 120.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of manufacturing a semiconductor device, the method comprising:
   forming an etch target layer on a semiconductor substrate;
   forming a preliminary mask pattern on the etch target layer, the preliminary mask pattern being formed to have a planar shape corresponding to a design layout that includes wave line type patterns which are arrayed in parallel and each of the wave line type patterns being formed to include a plurality of main pattern portions serially arrayed in each column and a plurality of connection bar pattern portions for connecting the plurality of main pattern portions in each column;
   forming node separation walls on sidewalls of the preliminary mask patterns to provide an array of main space portions which are located at both sides of each of the connection bar pattern portions;
   removing the main pattern portions to provide an array of additional space portions which are separated from the main space portions by the node separation walls;
   etching the etch target layer using the node separation walls as etch masks to form an array of through holes penetrating the etch target layer; and
   forming an array of nodes which are disposed in respective ones of the through holes.

2. The method of claim 1, wherein the connection bar pattern portions have a width which is less than a width of the main pattern portions.

3. The method of claim 1:
   wherein the wave line type patterns are disposed such that bar space portions are defined between the main pattern portions arrayed in a direction which are perpendicular to the column; and
   wherein a width of the bar space portions is less than a width of the main space portions.

4. The method of claim 3, wherein the node separation walls are formed to fill the bar space portions and to separate the main space portions arrayed in a direction parallel with the column from each other.

5. The method of claim 3, wherein the node separation walls are formed to have a line width which is equal to or greater than half that of the bar space portions to fill the bar space portions.

6. The method of claim 1, wherein each of the main pattern portions is designed to have a square shape, a rectangular shape, a circular shape, an oval shape, a diamond shape, or a cross shape.

7. The method of claim 1, wherein removing the main pattern portions includes etching the preliminary mask pattern using the node separation walls as etch masks, and the connection bar pattern portions sandwiched between the node separation walls remain to separate the additional space portions arrayed in each column from each other when the main pattern portions are removed.

8. The method of claim 1, further comprising:
   forming a main mask layer having an etch selectivity with respect to the node separation walls on the etch target layer prior to formation of the preliminary mask pattern; and
   etching the main mask layer using the node separation walls as etch masks to form an main mask pattern.

9. The method of claim 8:
   wherein the main mask layer is formed to include a silicon nitride layer;
   wherein the node separation walls are formed to include an ultra low temperature oxide (ULTO) layer; and
   wherein the preliminary mask pattern is formed to include a spin on carbon (SOC) layer.

10. The method of claim 1, wherein each of the through holes is formed to have a diamond shape or an oval shape in a plan view due to the presence of the connection bar pattern portions.

11. The method of claim 1, wherein each of the nodes is formed to have a cylindrical shape or a pillar shape.

12. A method of manufacturing a semiconductor device, the method comprising:
   forming an etch target layer on a semiconductor substrate;
   forming a preliminary mask pattern on the etch target layer, the preliminary mask pattern being formed to have a planar shape corresponding to a design layout that includes wave line type patterns which are arrayed in parallel and each of the wave line type patterns being formed to include a plurality of main pattern portions serially arrayed in each column and a plurality of connection bar pattern portions for connecting the plurality of main pattern portions in each column;
   forming node separation walls on sidewalls of the preliminary mask patterns to provide an array of main space portions which are defined at both sides of each of the connection bar pattern portions;
   removing the main pattern portions to provide an array of additional space portions which are separated from the main space portions by the node separation walls;
   etching the etch target layer using the node separation walls as etch masks to form an array of through holes penetrating the etch target layer;
   forming storage nodes in respect ones of the through holes;
   removing the etch target layer; and
   sequentially forming a dielectric layer and a plate node on the storage nodes to form cell capacitors.

13. The method of claim 12, wherein forming the preliminary mask pattern includes:
   forming a preliminary mask layer on the etch target layer;
   designing one of the wave line type patterns such that a width of the connection bar pattern portion is less than a width of the main pattern portion;
   obtaining a design layout by repeatedly arraying the designed wave line type pattern in parallel such that regions between the main pattern portions of the arrayed wave line type patterns provide bar space portions which are narrower than a width of the main pattern portions; and
   transferring the design layout including the arrayed wave line type patterns onto the preliminary mask layer using a lithography process.

14. The method of claim 13, wherein the node separation walls are formed to fill the bar space portions and to separate the main space portions arrayed in a direction parallel with the column from each other.

15. The method of claim 12, wherein removing the main pattern portions includes etching the preliminary mask pattern using the node separation walls as etch masks, and the connection bar pattern portions sandwiched between the node separation walls remain to separate the additional space portions arrayed in each column from each other when the main pattern portions are removed.

16. The method of claim 12, further comprising:
 forming a main mask layer having an etch selectivity with respect to the node separation walls on the etch target layer prior to formation of the preliminary mask pattern; and
 etching the main mask layer using the node separation walls as etch masks to form an main mask pattern.

17. The method of claim 12, further comprising forming a floating support layer on the etch target layer prior to formation of the preliminary mask pattern.

18. The method of claim 17, wherein removing the etch target layer includes:
 etching portions of the floating support layer to form windows exposing portions of the etch target layer; and
 supplying an etchant for removing the etch target layer though the windows.

19. The method of claim 18, wherein forming the windows includes:
 forming an etch mask layer covering the storage nodes;
 forming a floating support mask exposing portions of the etch mask layer on the etch mask layer; and
 etching the etch mask layer and the floating support layer using the floating support mask as an etch mask.

20. The method of claim 12, wherein forming the storage nodes includes:
 conformally forming a storage node layer on the substrate having the through holes;
 forming protection patterns in respective ones of the through holes surrounded by the storage node layer; and
 removing portions of the storage node layer exposed by the protection patterns.

\* \* \* \* \*